(12) United States Patent
Neumann et al.

(10) Patent No.: US 9,648,774 B2
(45) Date of Patent: May 9, 2017

(54) FREQUENCY CONVERTER AND SPRING ELEMENT THEREFOR

(71) Applicant: Lenze Automation GmbH, Aerzen (DE)

(72) Inventors: Edmund Neumann, Hameln (DE); Uwe Beilfuss-Spickmann, Hessisch Oldendorf (DE); Andreas Wempe, Gross Berkel (DE); Frank Oltmann, Altenoythe (DE)

(73) Assignee: Lenze Automation GmbH, Aerzen (DE)

( * ) Notice: Subject to any disclaimer, the term of this patent is extended or adjusted under 35 U.S.C. 154(b) by 100 days.

(21) Appl. No.: 14/356,446

(22) PCT Filed: Nov. 7, 2012

(86) PCT No.: PCT/EP2012/072015
§ 371 (c)(1),
(2) Date: May 6, 2014

(87) PCT Pub. No.: WO2013/068391
PCT Pub. Date: May 16, 2013

(65) Prior Publication Data
US 2014/0334118 A1    Nov. 13, 2014

(30) Foreign Application Priority Data

Nov. 7, 2011  (DE) ........................ 10 2011 085 872

(51) Int. Cl.
*H05K 7/14* (2006.01)
*H01R 9/24* (2006.01)
(Continued)

(52) U.S. Cl.
CPC ......... *H05K 7/1417* (2013.01); *H01R 9/2458* (2013.01); *H05K 7/1427* (2013.01);
(Continued)

(58) Field of Classification Search
CPC ........ H02M 1/00; H02M 7/00; H05K 7/1417; H05K 7/1427; H05K 7/1432; H05K 7/1471; H01R 12/52; H01R 12/55
(Continued)

(56) References Cited

U.S. PATENT DOCUMENTS

| | | | | |
|---|---|---|---|---|
| 2,713,668 A | * | 7/1955 | Gibilisco | H01R 4/4836 |
| | | | | 439/438 |
| 4,691,274 A | * | 9/1987 | Matouk | G06F 1/18 |
| | | | | 165/80.3 |

(Continued)

FOREIGN PATENT DOCUMENTS

| | | |
|---|---|---|
| DE | 1 057 199 B | 5/1959 |
| DE | 82 13 627 U1 | 8/1982 |

(Continued)

OTHER PUBLICATIONS

Corresponding International Search Report with English Translation dated Jul. 1, 2013 (five (5) pages).

*Primary Examiner* — Courtney Smith
*Assistant Examiner* — Matt Dhillon
(74) *Attorney, Agent, or Firm* — Crowell & Moring LLP (57) ABSTRACT

A frequency converter (10a, 10b, 10c) includes a housing (30), a circuit board (12a) arranged in the housing, and a coupling arrangement (20) arranged externally on the housing (30) for galvanically coupling the circuit board (12a) to an adjacently arranged second frequency converter (10b, 10c), wherein the coupling arrangement (20) either comprises a base portion (22) and a coupling member (26) movable with respect to the base portion (22) along a defined movement path, or is formed as a rigid busbar which is designed for simultaneous attachment to the frequency converter and the second frequency converter, and the coupling arrangement (22) is galvanically coupled to the circuit board (12a). The coupling arrangement (22) is connected to the (Continued)

circuit board (12a) by a spring element (40), wherein this spring element (40) has a fastening portion (44) on the circuit board side and a fastening portion (42) on the coupling arrangement side. The fastening portions are interconnected by a resilient spring portion (46).

9 Claims, 4 Drawing Sheets (51) Int. Cl.
     *H01R 4/34*          (2006.01)
     *H01R 12/52*         (2011.01)
     *H01R 12/55*         (2011.01)

(52) U.S. Cl.
     CPC ......... H05K 7/1432 (2013.01); H05K 7/1471 (2013.01); *H01R 4/34* (2013.01); *H01R 12/52* (2013.01); *H01R 12/55* (2013.01)

(58) Field of Classification Search
     USPC .................................................. 361/752, 795
     See application file for complete search history.

(56) References Cited

U.S. PATENT DOCUMENTS

| | | | | |
|---|---|---|---|---|
| 4,956,604 A | * | 9/1990 | Cedrone | G01R 1/0433 324/754.07 |
| 4,992,925 A | * | 2/1991 | Meyer | H02M 7/003 361/688 |
| 5,245,527 A | * | 9/1993 | Duff | H05K 7/1432 361/610 |
| 5,409,407 A | * | 4/1995 | Mizuno | H01R 13/113 439/441 |
| 5,494,456 A | * | 2/1996 | Kozel | H01R 4/4827 439/439 |
| 5,644,304 A | * | 7/1997 | Pavarotti | H05B 37/038 315/130 |
| 6,191,948 B1 | * | 2/2001 | Beyer | H02B 1/056 174/68.2 |
| 6,208,531 B1 | * | 3/2001 | Vinciarelli | H01F 38/14 363/21.07 |
| 6,542,378 B2 | * | 4/2003 | Jacobsen | H02K 11/33 361/774 |
| 6,675,302 B2 | * | 1/2004 | Ykema | H02J 13/0086 361/614 |
| 7,002,078 B2 | * | 2/2006 | Kunick | H05K 7/1465 174/135 |
| 7,104,833 B2 | * | 9/2006 | Oesterhaus | H01R 4/4836 439/441 |
| 7,238,043 B2 | * | 7/2007 | Reibke | H01R 4/4827 439/441 |
| 8,094,435 B2 | * | 1/2012 | Howes | H05K 7/1432 318/370 |
| 8,251,738 B2 | * | 8/2012 | Heckert | H01R 4/4836 439/441 |
| 8,278,790 B2 | * | 10/2012 | Rueggen | H02K 11/33 310/68 D |
| 2002/0155750 A1 | * | 10/2002 | Beege | H01R 4/4836 439/441 |
| 2006/0063420 A1 | * | 3/2006 | Reibke | H01R 4/4827 439/441 |
| 2011/0164350 A1 | * | 7/2011 | Kanaya | H05K 7/1432 361/624 |
| 2013/0072072 A1 | * | 3/2013 | Fehling | H01R 4/4818 439/816 |
| 2014/0361634 A1 | * | 12/2014 | Scholz | H04B 5/0031 307/104 |

FOREIGN PATENT DOCUMENTS

| | | |
|---|---|---|
| DE | 40 23 914 A1 | 2/1992 |
| DE | 297 19 226 U1 | 3/1999 |
| DE | 102 30 393 A1 | 1/2004 |
| DE | 103 22 196 A1 | 3/2005 |
| DE | 10 2005 045 554 B3 | 4/2007 |
| DE | 10 2008 020 503 A1 | 10/2009 |
| WO | WO 93/13587 A1 | 7/1993 |

* cited by examiner

FREQUENCY CONVERTER AND SPRING ELEMENT THEREFOR

FIELD OF APPLICATION AND PRIOR ART

The invention relates to a frequency converter and a spring element therefor. A generic frequency converter has a housing, a circuit board arranged in the housing for receiving power electronic components, and a coupling arrangement arranged externally on the housing for galvanically coupling the circuit board to an adjacently arranged second frequency converter. Here, the coupling arrangement either comprises a base portion and a coupling member movable with respect to the base portion along a defined movement path, or is formed as a rigid busbar which is designed for simultaneous attachment to the frequency converter and the second adjacently arranged frequency converter. This coupling arrangement is galvanically coupled to the circuit board of the frequency converter.

Generic frequency converters are used to convert the frequency of current, in particular for the purpose of supplying a three-phase motor of a machine, for example of robots, manufacturing machines, conveying machines or the like.

A plurality of consumers, for example a plurality of three-phase motors, often makes it necessary to use more than one frequency converter of the generic type. To this end, it is known to produce a current-conducting galvanic coupling between this plurality of frequency converters, for example in order to create a common intermediate circuit. Since high electric powers are used in the region in question of the frequency converters, it is of the greatest importance that the plurality of frequency converters are galvanically coupled to one another reliably.

To this end, various systems are known from the prior art. For example, it is thus known to use rigid metal busbars which are attached externally to frequency converters and mechanically and galvanically couple said frequency converters. It is also known from DE 102 30 393 A1 to use a coupling arrangement of the type already mentioned having a metal base portion and a coupling member pivotable with respect to the base portion along a defined movement path. DE 102 30 393 A1 describes pivoted levers which are attached pivotably to a frequency converter and can be pivoted in such a way that they can be fixed by means of a fastening screw of an adjacent frequency converter.

A problem of such a rigid interconnection of the frequency converters is that the aforementioned coupling arrangements are attached to the frequency converter in a precisely defined position and orientation, in contrast to flexible connection cables, wherein this orientation is dependent on the attachment of the coupling arrangement to two or more frequency converters adjacent to one another. Since the precise position and orientation of the individual coupling arrangement is also dependent on the attachment thereof to an adjacent frequency converter, a rigid connecting member provided between the coupling arrangement and the circuit board can subject the circuit board of the frequency converter to permanent loading with force. Such a permanent application of force to a circuit board may lead however to a critical failure of the circuit board or the galvanic coupling between coupling arrangement and circuit board, for example by breakage of the soldered connection used there. Due to the high electric power which is to be transmitted, a break in the conductive path on a circuit board may lead for example to an immediate and complete destruction of the frequency converter and possibly also adjacent frequency converters. Manufacturing tolerances at a frequency converter itself may also mean that a rigid connection between the coupling arrangement of said frequency converter and the circuit board thereof may lead to a critical loading of the circuit board with force.

The galvanic coupling which is created between the coupling arrangement and the respective circuit boards of the frequency converters could alternatively be produced by means of connection cables arranged in the housing of the frequency converter, wherein this leads in practice to an increased assembly complexity.

Problem and Solution

The problem addressed by the invention is that of developing a generic frequency converter to the effect that excessively high applications of force to the circuit board are avoided in spite of the possibility for rigid coupling of the frequency converter to one or more adjacent frequency converters. This development should be accompanied by simple assembly.

This problem is solved in accordance with the invention in that the coupling arrangement is connected to the circuit board by means of a spring element, wherein this spring element comprises a fastening portion on the circuit board side and a fastening portion on the coupling arrangement side, said fastening portions being interconnected by a resilient spring portion.

In accordance with the invention the aforementioned spring element is therefore provided between, on the one hand, the coupling arrangement on the outer face of the housing of the frequency converter, of which the actual position and orientation are also dependent on the arrangement of adjacent frequency converters and on manufacturing tolerances with respect to the housing, and, on the other hand, the circuit board of the frequency converter, said spring element preventing deviations in the position of the coupling arrangement from a predefined target position from being translated into an excessively high loading of the circuit board or soldering points with force. Here, the spring element is preferably formed in such a way that a displacement of the coupling arrangement with respect to a target position of 1 mm leads to a loading of the circuit board with force in the corresponding direction of no more than 1 newton.

In contrast to a cable connection, which could be provided alternatively to the spring element at the same point, the spring element to be used in accordance with the invention makes it possible, when the housing is closed, to fasten the coupling arrangement to the fastening portion of the spring element on the coupling arrangement side, for example by means of a screw, without further intermediate elements to be provided on the housing side. The spring element is sufficiently rigid for this purpose, such that the fastening portion of the spring element on the coupling arrangement side, once the housing has been closed, is located in a region immediately behind the wall of the housing. This makes it possible, once the housing has been closed, to connect the coupling arrangement from the outside to the fastening portion which is on the coupling arrangement side and which is arranged at least approximately in a defined position. Since there is thus no longer the requirement to first connect the circuit board to an intermediate element fixed on the housing side, the assembly process can be carried out very easily. The circuit board is inserted into the housing or the housing is slid over the circuit board. The spring element already connected to the circuit board at this moment in time is inserted here together with the circuit board into the housing and, in the end position of the circuit board, already assumes the target position, which can be reproduced at least approximately. This target position is selected in such a way that the coupling arrangement can then be connected from the outside to the fastening portion of the spring element, preferably directly.

The spring element itself may be a simple component formed from a metal sheet, which is bent once or more in order to bridge the path in a versatile manner between the circuit board and the target position of the fastening portion on the coupling arrangement side. A design of the spring element in which it is produced from a bent sheet metal and has at least two mutually parallel predetermined bending lines, along which sheet metal portions can be pivoted in a limited manner with respect to one another on either side of the respective predetermined bending line, has proven to be particularly advantageous. Due to the design with two mutually parallel predetermined bending lines, an at least three-membered design of the sheet metal portions is achieved, which for example allows a parallel displacement of a sheet metal portion arranged at one end with respect to the sheet metal portion arranged at the other end. A design with three mutually parallel predetermined bending lines is considered to be even better. A four-membered design is thus to be achieved, with which two intermediate portions are provided between the fastening portion on the circuit board side and the fastening portion on the coupling arrangement side. Unlimited movability of the fastening portions with respect to one another is provided with such a design from a purely geometric point of view by means of the predetermined bending line. It is thus also possible for the fastening portions to be movable in translation, comparatively freely, with respect to one another in a plane perpendicular to the extension of the predetermined bending lines. The movement of the fastening portions with respect to one another in a first direction, due to the four-membered design, does not lead to the geometrically induced enforcement of a movement orthogonal to the first direction.

The predetermined bending lines are preferably formed by bending lines already provided with the unstressed main body of the spring element and naturally are less resistant to a pivoting motion than a planar sheet metal portion.

The fastening portion on the coupling arrangement side and/or the fastening portion on the circuit board side of the spring element is/are preferably an integral part of the same bent sheet metal also forming the spring portion. It is also possible however in principle to use separate fastening portions, which for example are connected to the spring element by means of a soldered connection.

A screw connection is preferably provided in order to connect to one another the coupling arrangement and the fastening portion on the coupling arrangement side. The fastening portion on the coupling arrangement side therefore preferably comprises a threaded bore or has a nut attached in a manner fixed against rotation, said nut having a threaded bore. A screw then allows the coupling arrangement to be pressed flat against a corresponding face of the fastening portion and therefore to create an electric connection of very low resistance.

Indeed, it is in principle also conceivable to use the screw itself as a single galvanic connection between the fastening portion and the coupling arrangement. The aforementioned flat pressing of the coupling arrangement and of the fastening portion against one another is preferred however. Since the fastening portion is provided however in the housing and the coupling arrangement is provided on an outer face of the housing, the housing, in the region of the coupling arrangement, preferably further comprises an opening, through which the fastening portion on the coupling arrangement side and the coupling arrangement are interconnected, preferably directly.

Here, this opening is preferably adapted to the fastening portion on the coupling arrangement side and to the coupling arrangement in such a way that the fastening portion on the coupling arrangement side and the coupling arrangement secure one another in their respective positions. Such a positional securing is understood to mean that both the coupling arrangement outside the housing and the fastening portion inside the housing protrude beyond the size of the opening at least in portions, such that, once the coupling arrangement and the fastening portion have been fastened to one another, this bond can be neither pushed further into the housing nor drawn outwardly from the housing.

The coupling arrangement is preferably arranged in a recess on the outer face of the housing, said recess at least roughly predefining the position of the coupling arrangement. Here, this recess should have sufficient play however to allow the coupling of the coupling arrangement to adjacent frequency converters, which possibly may not be positioned exactly.

The coupling arrangement is connected here preferably exclusively to the fastening portion on the coupling arrangement side in a manner that is to be detached only by means of a tool. It is possible to dispense with a direct screwing of the coupling arrangement on the housing. As soon as the coupling arrangement is detached from the fastening portion on the coupling arrangement side by loosening the screw or another fastening means, the coupling arrangement can also be separated from the housing.

It is also considered to be advantageous if alignment devices, in particular an alignment recess on the one hand and an alignment pin on the other hand, are provided on the housing and on the fastening portion on the coupling arrangement side and/or on the housing and on the coupling arrangement. Since a fixed connection, created by means of a tool or for example a detent connection, preferably is not provided between the coupling arrangement and the housing and/or between the fastening portion on the coupling arrangement side and the housing, corresponding alignment devices are advantageous. In the case of the fastening portion on the coupling arrangement side, these alignment devices cause said fastening portion to assume quite precisely the target position merely by sliding the housing over the circuit board, then allowing the coupling arrangement to be screwed tightly from the outside. In the case of the coupling arrangement itself, corresponding alignment means are of little relevance, but may also be advantageous since a largely consistent relative positioning can already be achieved hereby as a result of the fact that the coupling arrangement is screwed tightly on the fastening portion on the coupling arrangement side.

Alignment devices for aligning the spring element with respect to the housing may serve simultaneously as torque supports. They prevent the spring element as a whole from being rotated when tightening a fastening screw in order to fasten the coupling arrangement.

In principle, the design of the frequency converter according to the invention is expediently independent of the potential thus used jointly by two or more frequency converters. However, it is considered to be particularly advantageous if the coupling arrangement is galvanically coupled to an intermediate circuit potential of the frequency converter. It is further advantageous if two coupling arrangements of this type are provided and are each connected by means of their own spring element to the main circuit board. A common intermediate circuit voltage is therefore to be used for a plurality of frequency converters.

Besides the frequency converter itself, the invention also concerns the spring element used therefor, said spring element being intended for galvanic coupling to a circuit board of the frequency converter and being designed for this purpose. The spring element according to the invention is characterized by a fastening portion on the circuit board side and a fastening portion on the coupling arrangement side. These fastening portions are interconnected by a resilient spring portion. Here, the spring element is produced from a bent sheet metal and has at least two mutually parallel predetermined bending lines, along which sheet metal portions can be pivoted to a limited extent with respect to one another on either side of the respective predetermined bending lines.

BRIEF DESCRIPTION OF THE DRAWINGS

Further aspects and advantages of the invention will become clear from the claims and also from the following description of a preferred exemplary embodiment of the invention, which will be explained hereinafter on the basis of the figures, in which:

DETAILED DESCRIPTION OF THE EXEMPLARY EMBODIMENT

Figures 1A, 1B:
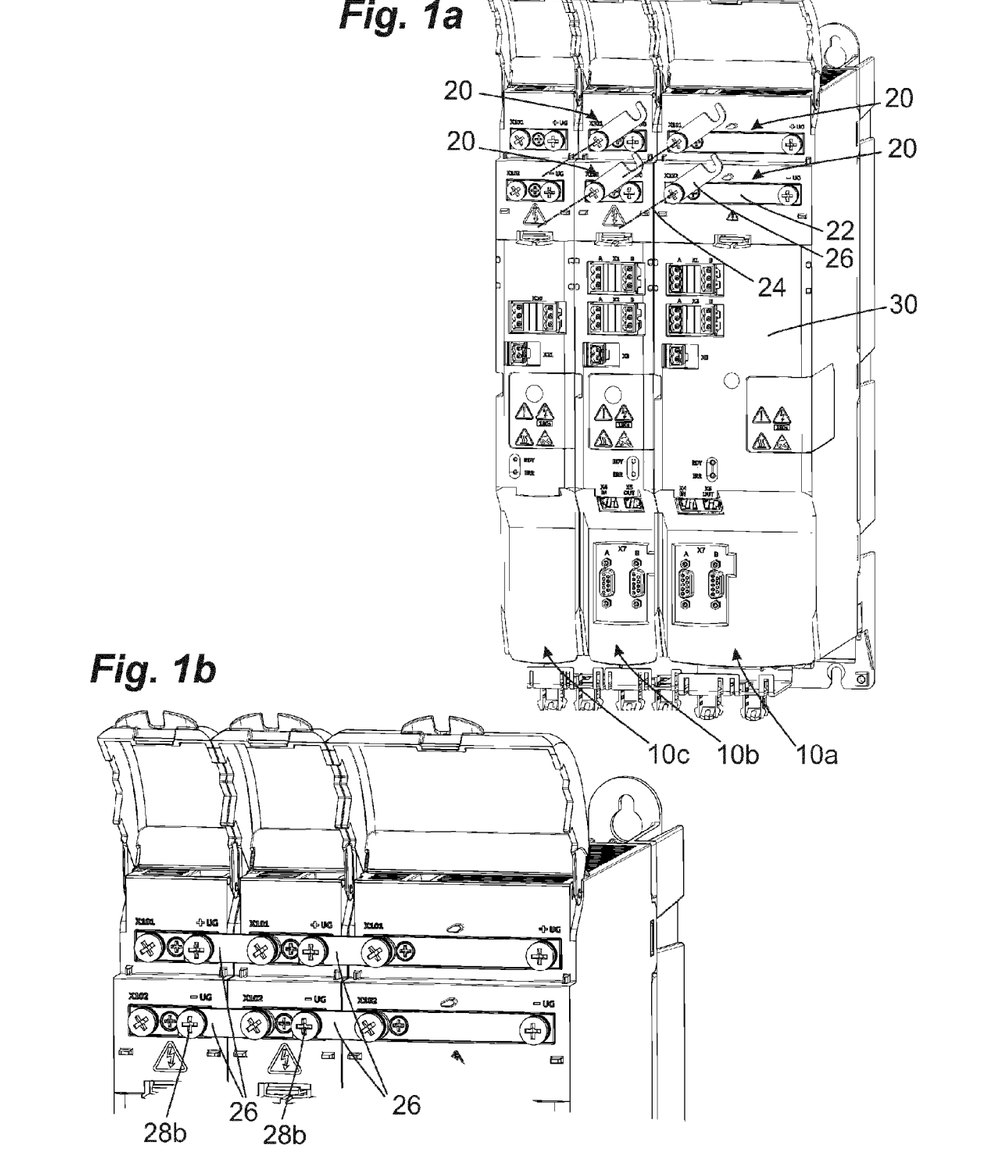
FIGS. 1a and 1b show an arrangement with three frequency converters according to the invention, of which the intermediate circuits are galvanically coupled to one another.

FIGS. 1a and 1b show an arrangement with three frequency converters 10a, 10b, 10c. These frequency converters are used in the illustrated combination, for example in order to control three-phase motors used for different degrees of freedom of an actuator of a machine.

The frequency converters 10a, 10b, 10c, which are also each fully functional individually, are galvanically coupled to one another at their intermediate circuit. To this end, they comprise coupling arrangements 20, which are provided in each case in pairs on an outer face of the frequency converters. The coupling arrangements 20 each comprise a metal base portion 22 for substantially stationary attachment to an outer face of the respective housing 30 of the frequency converter, and, in the case of the frequency converters 10a, 10b, a coupling portion 26, likewise made of metal, which is pivotable about an axis 24 with respect to said base portion 22. These coupling portions 26 are provided, as can be seen in FIG. 1B, to be pivoted into the region of the base portion 20 of the adjacent frequency converter 10b, 10c so as to be fixed there by means of a fastening screw 28b.

In order to ensure a problem-free flow of current having the lowest resistance possible, the pivotable coupling portions 26 are guided on the respective base portion 22 without play where possible. For the same reason, the screw 28 is also tightened in the conventional manner in order to ensure a planar connection of low resistance between the coupling portion 26 of the frequency converter 10a and the base portion 22 of the adjacent frequency converter 10b for example. A disadvantage of this rigid connection is that the respective base portions 22 of the upper and lower row of coupling arrangements 20 are fixed relative to one another in a stationary manner and therefore assume a position that is variable to a low, yet decisive extent, for example due to positioning that is not completely accurate of the respective frequency converters 10a, 10b, 10c as a whole relative to the circuit board 12a provided in the frequency converters. Manufacturing tolerances on a frequency converter also may lead to a variability of the coupling arrangement 20 with respect to the circuit board 12a.

If, in such cases, contrary to the invention, a completely rigid connection were created between the respective base portions 22 and the respective circuit boards within the housing 30 of the frequency converters 10a, 10b, 10c, the inaccuracy, which is difficult to avoid, of the precise arrangement and alignment of the base portions 22 would thus lead to a high introduction of force into the circuit board. There would be a risk of failure of soldering points or conductive paths with serious consequences.

Figure 2:
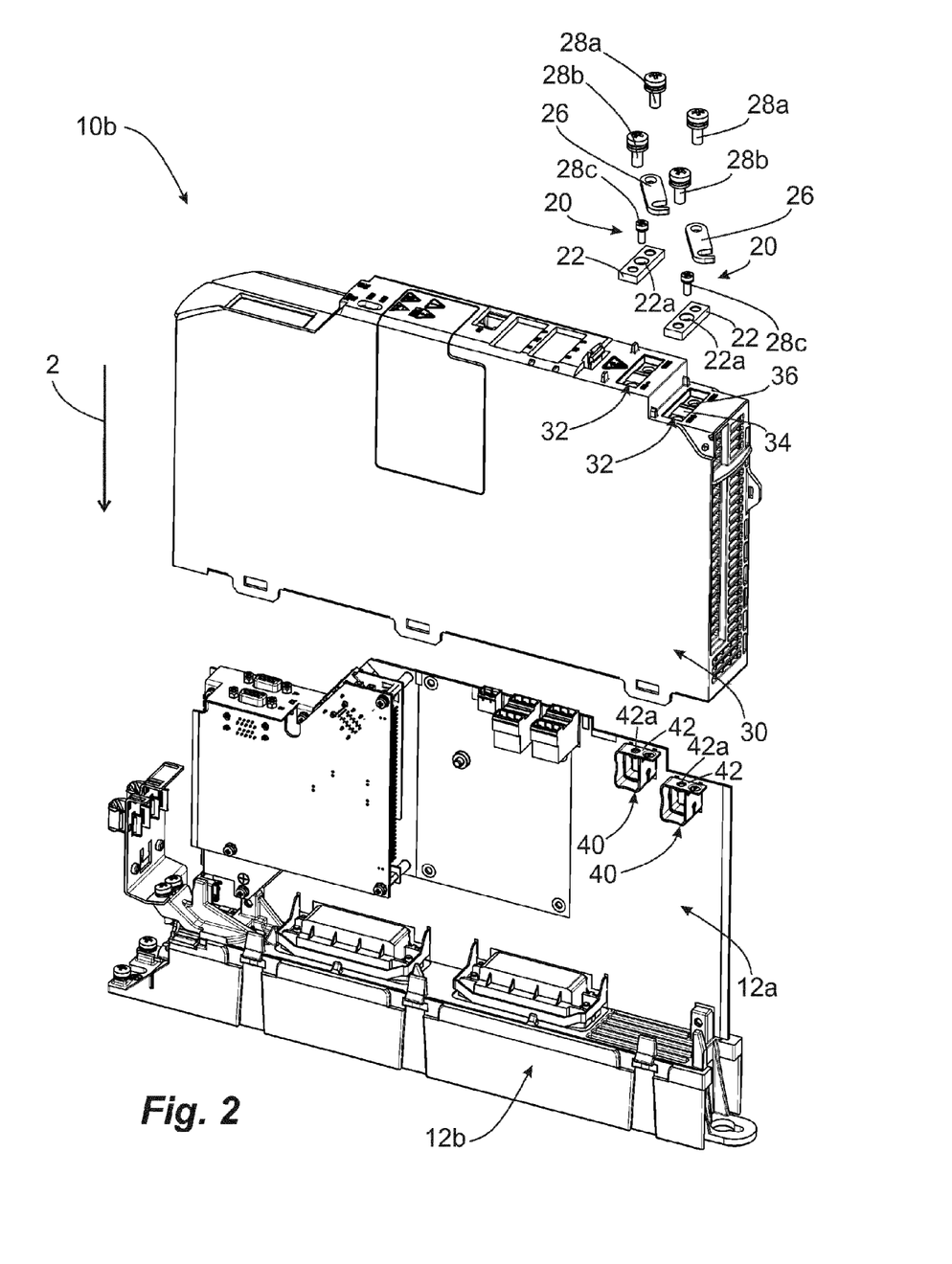
FIG. 2 shows one of these frequency converters in an exploded view, from which the components essential to this invention can be seen in an isolated manner.

FIG. 2 illustrates the fundamental structure of a frequency converter according to the invention which solves this problem. Here, FIG. 2 illustrates an exploded view. The components illustrated here comprise a main circuit board 12a with a heat sink 12b fastened thereon which simultaneously also serves for attachment of the frequency converter 10b to a wall of a switch cabinet. A shell-like housing 30 made of plastic can be slid over the circuit board. Recesses 32 are provided on the outer face of this housing in order to receive the base portions 22 of the coupling arrangements 20.

Two spring elements 40 soldered fixedly to the circuit board are provided for contacting the respective base portions 22, the arrangement of said spring elements corresponding to the arrangement of the recesses 32. Each of these spring elements is connected galvanically on the circuit board to an intermediate circuit conductor.

In accordance with conventional assembly, the housing 30 is now slid over the circuit board 12a in the direction of the arrow 2. The spring elements 40 thus reach a position immediately beneath the recesses 32. The respective fastening portion 42 provided at the distal end of the respective spring element 40 is not fixed completely to the housing 12. Merely alignment devices are provided on sides of the fastening portion and on sides of the housing in order to ensure the correct positioning of fastening portions 42 of the spring elements 40 on the coupling arrangement side and to serve as torque supports. This will be explained in greater detail further below.

Once the housing 30 has been slid over the circuit board 12a and the fastening portions 42 on the coupling arrangement side are thus arranged approximately in their target position, the coupling arrangements 20 are attached. The base portions 22 of the coupling arrangements are inserted into the recesses 32. A screw 28c is then screwed through each through-bore 22a in the base portions 22 into a threaded bore 42a of the respective spring element 40.

Figure 3:
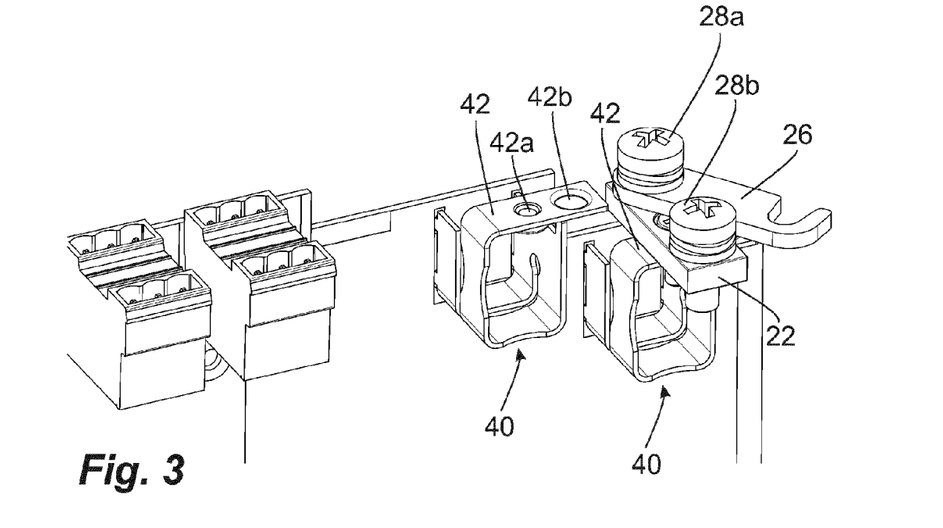
FIG. 3 shows a portion of the main circuit board of the frequency converter with spring elements attached thereto.

With the housing 30 removed, an arrangement as is illustrated by FIG. 3 is produced. The fastening portion 42 of the spring elements 40 on the coupling arrangement side bears here in a planar manner against the base portion 22 of the coupling arrangements 20. A flow of current of low resistance is thus possible. The two screws 28a, 28b, the first screw 28a serving to pivotably link the coupling portion 26 and the second screw 28b serving to fix the coupling portion 26 of the adjacent frequency converter, extend through the base portion 22. Their free end engages with threadless recesses 36 (not illustrated in FIG. 3) of the housing 30, such that alignment devices are thus provided.

The positional securing of the base portion 22 and of the fastening portion 42 on the coupling arrangement side is achieved by attaching these components to one another. A respective opening 34 at the base of the respective recess 32, through which the spring element 40 and the base portion 22 are interconnected, has a size and/or shaping which prevents the base portion 22 from being inserted further than desired into the housing and also prevents the fastening portion 42 from being removed from the housing. Both the fastening portion 42 and the base portion 22 protrude beyond the opening 34 at least in part.

Figure 4:
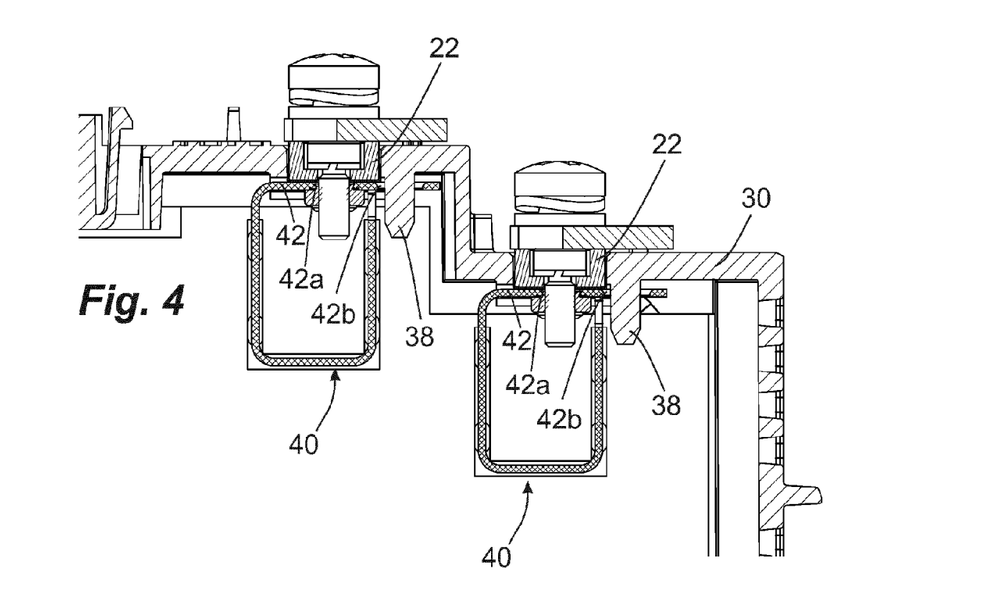
FIG. 4 shows the portion of FIG. 3 in a sectional illustration.

This form of positional fixing is also clear with regard to the fastening portion 42 with reference to the sectional illustration of FIG. 4. The opening 34 is sufficiently large however to ensure a direct surface contact between the fastening portion 42 and the base portion 22.

It can also be seen from FIG. 4, which shows the portion of FIG. 3 in a sectional illustration, that the alignment devices for positioning the spring element 40 relative to the housing 30 comprise an alignment pin 38 on the inner face of the housing and a corresponding alignment bore 42b on the spring element. As the housing 30 is brought toward the spring element 40, it is aligned as desired also due to these alignment devices 38, 42b, then allowing the screws 28c to be screwed in so as to fix the respective base portion 22. It can also be seen from FIG. 4 that the fastening portion 42 of the spring element 40 bearing against the housing is of such a size that it cannot be removed from the housing together with the base portion 22.

If the alignment pin 38 is arranged in the alignment bore 42b, it also serves simultaneously as a torque support, which prevents excessively high forces from acting on the soldered connection between the spring element 40 and the circuit board 12a due to a rotation of the spring element 40 as the screw 28c is tightened.

Figure 5:
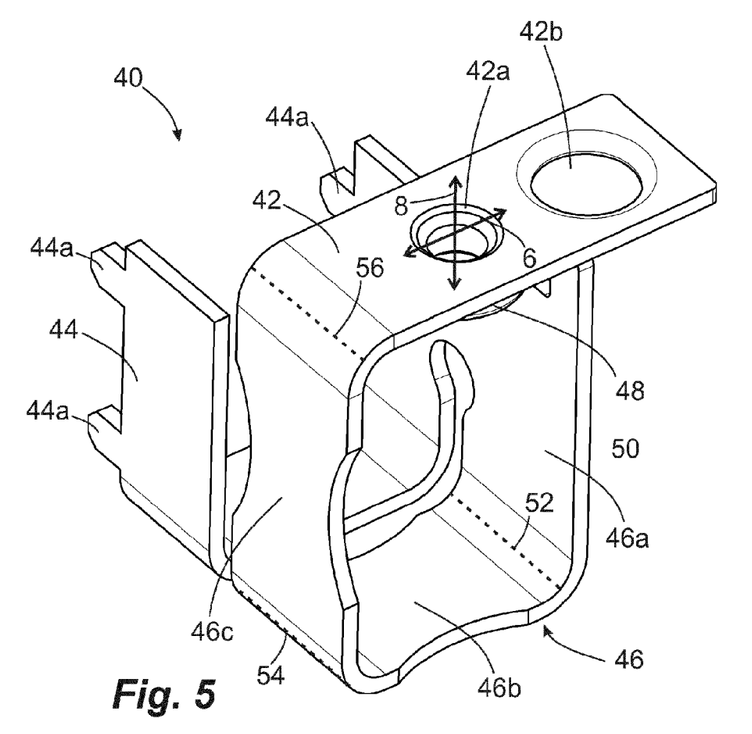
FIG. 5 shows a detail of a spring element of the previously shown frequency converter.

FIG. 5, in a separate illustration, shows a spring element 40 used in the frequency converter according to the invention. This spring element has a U-shaped fastening portion 44, which is arranged on the circuit board side and which is fixedly soldered on the circuit board 12a in the region of four soldering portions 44a. The misaligned arrangement of the soldering portion 44a leads to a stable fixing of the fastening portion 44 on the circuit board 12a. The introduction of a force at the other end of the spring element, that is to say the fastening portion 42 on the coupling arrangement side, leads to an insignificant introduction of force into the soldering portions 44a on the left-hand side in FIG. 5, such that the connection between the spring element 40 and the circuit board is maintained even in adverse circumstances.

At the end opposite the fastening portion 44 on the circuit board side, the spring element 40 is provided with the aforementioned fastening portion 42 on the coupling arrangement side. This has a threaded bore 42a and an alignment bore 42b in the manner already described. The threaded bore could have a thread introduced directly into the sheet metal of the spring element 40. In the present case however a nut 48 with inner thread is instead fastened on the fastening portion 42 in a manner fixed against rotation. The fastening portion 42 on the coupling arrangement side is no longer movable with respect to the associated base portion 22 once this has been attached.

The actual spring portion 46, which enables a variable positioning of the fastening portions 42, 44 relative to one another without resulting in a strong introduction of force into the circuit board 12a, is provided between the two fastening portions 42, 44. The spring portion is therefore designed/attached such that, with just a low introduction of force, it allows a displacement of the fastening portion 42 with respect to the fastening portion 44 without thereby resulting in a strong introduction of force into the soldered connection at the fastening portion 44 and/or into the circuit board 12a itself.

The spring portion for this purpose comprises a first sheet metal portion 46a, which is largely immobile with respect to the fastening portion 44 on the circuit board side. This is connected by means of two sheet metal portions 46b, 46c, attached to one another in a chain-like manner, to the fastening portion 42 on the coupling arrangement side. The sheet metal is bent along bending lines 52, 54, 56 between the portions 46a, 46b, 46c, 42, in each case by approximately 90°. These bending lines allow a movement of the fastening portions 42, 44 with respect to one another.

Figure 6A:
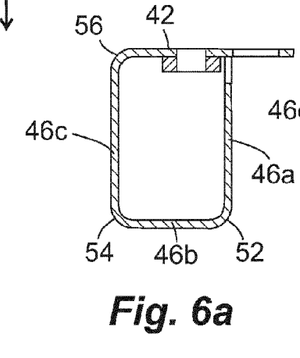
FIGS. 6a to 6c show the movability with respect to one another of fastening portions provided on the spring element on either side thereof.
Figures 6B, 6C:
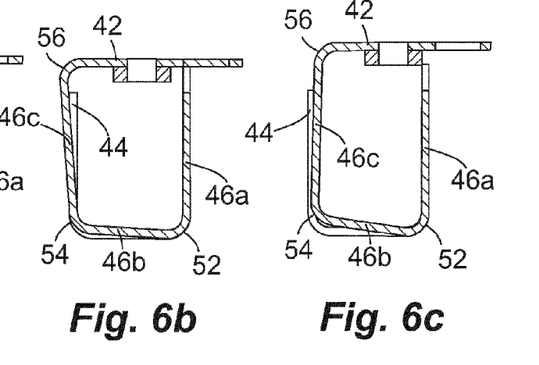

The movability is illustrated on the basis of FIGS. 6a to 6c. FIG. 6a illustrates the unstressed state of the spring element 40. FIG. 6b illustrates the fact that a horizontal displacement purely in translation of the fastening portion 42 is geometrically possible due to the two sheet metal portions 46b, 46c and the three bending lines 52, 54, 56. FIG. 6c shows that a displacement in the vertical direction and a displacement in translation are also possible at the same time. Due to the three bending lines 52, 54, 56 and the two sheet metal portions 46b, 46c between the fastening portions 42, 44, these horizontal and vertical displacements are geometrically independent of one another. The spring element 40 can therefore compensate well for tolerances in terms of the arrangement of the coupling arrangement 20 relative to the circuit board 12a in the plane of the arrows 6 and 8. Due to a twisting of the spring portion 46, a tolerance compensation transversely hereto is also possible within certain limits.

The spring element is formed in such a way that the sheet metal portion 46a also serves as a support for the fastening portion 42. This can therefore deflect downwardly only to a limited extent when the coupling arrangement 20 is screwed tight.

The invention claimed is:
1. A frequency converter, comprising:
a housing;
a circuit board arranged in the housing;
a coupling arrangement arranged externally on the housing, the coupling arrangement being configured to galvanically couple the circuit board to an adjacently arranged second frequency converter; and
a spring element connected to the circuit board by a soldered connection,
wherein
the coupling arrangement either:
(i) comprises a base portion and an external coupling member movable with respect to the base portion along a defined movement path, or
(ii) is a rigid external busbar,
the coupling arrangement is galvanically coupled to the circuit board via the spring element, and the spring element comprises
- a fastening portion on the circuit board side,
- a fastening portion on the coupling arrangement side having an exterior face portion at an aperture in a surface of the housing arranged to receive the coupling arrangement with the coupling member or busbar aligned parallel to the housing surface, and
- a resilient spring portion connecting said fastening portions.

2. The frequency converter as claimed in claim 1, wherein the spring element is produced from a bent sheet metal and has at least two mutually parallel predetermined bending lines, along which sheet metal portions are movable in a limited manner with respect to one another on either side of the respective predetermined bending line.

3. The frequency converter as claimed in claim 1, wherein the coupling arrangement and the fastening portion arranged on the coupling arrangement side are interconnected via a screw connection.

4. The frequency converter as claimed in claim 1, wherein the housing, in the region of the coupling arrangement, comprises an opening through which the fastening portion on the coupling arrangement side and the coupling arrangement are interconnected, wherein the opening is adapted to the fastening portion on the coupling arrangement side and to the coupling arrangement such that the fastening portion on the coupling arrangement side and the coupling arrangement secure one another in their respective positions.

5. The frequency converter as claimed in claim 1, wherein the housing, on an outer face thereof, has a recess in which the coupling arrangement is arranged at least in portions.

6. The frequency converter as claimed in claim 1, wherein the coupling arrangement is connected merely to the fastening portion on the coupling arrangement side by a fixing that is to be detached only by use of a tool.

7. The frequency converter as claimed in claim 1, further comprising:
an alignment recess and an alignment pin configured to be received in the alignment recess to align the housing and the coupling arrangement, wherein one of the alignment recess and the alignment pin is provided on the housing and the other of the alignment recess and the alignment pin is provided on at least one of the fastening portion on the coupling arrangement side and the base portion of the coupling arrangement.

8. The frequency converter as claimed in claim 1, wherein the coupling arrangement is galvanically coupled to an intermediate circuit potential of an intermediate circuit of the frequency converter.

9. The frequency converter as claimed in claim 1, wherein two coupling arrangements are provided, the two coupling arrangements being respectively connected by way of their own spring element to the circuit board.

* * * * *